(12) United States Patent
Mikjaniec et al.

(10) Patent No.: US 10,591,964 B1
(45) Date of Patent: Mar. 17, 2020

(54) APPARATUS, SYSTEM, AND METHOD FOR IMPROVED HEAT SPREADING IN HEATSINKS

(71) Applicant: Juniper Networks, Inc., Sunnyvale, CA (US)

(72) Inventors: Travis S. Mikjaniec, Fremont, CA (US); Mahesh Nagarajan, Morgan Hill, CA (US); Henry K. Sim, Mountain View, CA (US); Daniel Farmer, Los Altos, CA (US); Attila I. Aranyosi, Sunnyvale, CA (US)

(73) Assignee: Juniper Networks, Inc, Sunnyvale, CA (US)

( * ) Notice: Subject to any disclaimer, the term of this patent is extended or adjusted under 35 U.S.C. 154(b) by 0 days.

(21) Appl. No.: 15/432,195

(22) Filed: Feb. 14, 2017

(51) Int. Cl.
*G06F 1/20* (2006.01)
*H05K 7/20* (2006.01)

(52) U.S. Cl.
CPC .............. *G06F 1/203* (2013.01); *H05K 7/208* (2013.01); *H05K 7/20309* (2013.01)

(58) Field of Classification Search
CPC ............ G06F 1/181–182; G06F 1/203; H05K 7/20218–20381; H05K 7/20409–20418; H05K 7/20009–202; H05K 7/20309; H05K 7/208; H05K 7/20172; H05K 7/20; H01L 23/367–3677; H01L 23/473; H01L 23/46–467
USPC ...... 361/676–678, 679.46–679.54, 688–723; 165/80.1–80.5, 104.33, 185; 174/15.1–15.3, 16.1–16.3, 547, 548; 257/712–722, E23.088; 24/453, 458–459; 454/184; 312/236
See application file for complete search history.

(56) References Cited

U.S. PATENT DOCUMENTS

| | | | |
|---|---|---|---|
| 5,180,942 A | 1/1993 | Marvin et al. | |
| 5,206,792 A | 4/1993 | Reynolds | |
| 5,243,218 A | 9/1993 | Zenitani et al. | |
| 5,495,889 A | 3/1996 | Dubelloy | |
| 5,602,392 A | 2/1997 | Owen et al. | |
| 5,909,358 A | 6/1999 | Bradt | |
| 5,984,691 A * | 11/1999 | Brodsky ........... | H01L 23/49811 439/66 |
| 6,058,012 A | 5/2000 | Cooper et al. | |

(Continued)

OTHER PUBLICATIONS

Heat pipe, https://en.wikipedia.org/wiki/Heat_pipe, pp. 1-14, as accessed on Jan. 29, 2017.

(Continued)

*Primary Examiner* — Tulsidas C Patel
*Assistant Examiner* — Razmeen Gafur
(74) *Attorney, Agent, or Firm* — FisherBroyles, LLP (57) ABSTRACT

The disclosed apparatus may include (1) a plurality of vapor chambers that (A) are mounted to a plurality of individual power components that dissipate heat within a computing device and (B) absorb heat dissipated by the plurality of individual power components within the computing device and (2) at least one thermal coupling that (A) physically bridges the plurality of vapor chambers to one another within the computing device and (B) facilitates heat transfer among the plurality of vapor chambers mounted to the individual power components. Various other apparatuses, systems, and methods are also disclosed.

15 Claims, 10 Drawing Sheets

(56) References Cited

U.S. PATENT DOCUMENTS

| | | | |
|---|---|---|---|
| 6,388,882 B1* | 5/2002 | Hoover | F28D 15/0266 165/104.33 |
| 6,626,233 B1* | 9/2003 | Connors | F28D 15/0233 165/104.33 |
| 6,779,595 B1 | 8/2004 | Chiang | |
| 6,940,164 B1 | 9/2005 | Yoshimatsu et al. | |
| 6,966,361 B2* | 11/2005 | Connors | F28D 15/0233 165/104.33 |
| 6,967,845 B2 | 11/2005 | Chiang et al. | |
| 7,277,286 B2 | 10/2007 | Lee | |
| 7,684,198 B2 | 3/2010 | Fang | |
| 7,719,842 B2 | 5/2010 | Kreissig et al. | |
| 7,755,895 B2 | 7/2010 | Ikeda | |
| 7,796,389 B2 | 9/2010 | Edmunds et al. | |
| 8,913,389 B2 | 12/2014 | Fukui et al. | |
| 9,159,642 B2 | 10/2015 | Kim et al. | |
| 9,167,723 B1 | 10/2015 | Kim et al. | |
| 9,198,328 B1 | 11/2015 | Kokas et al. | |
| 9,320,172 B2 | 4/2016 | Newhouse et al. | |
| 9,743,555 B2 | 8/2017 | Kim et al. | |
| 9,836,100 B2* | 12/2017 | Han | G03B 17/55 |
| 2002/0005272 A1 | 1/2002 | Hirano et al. | |
| 2002/0015288 A1* | 2/2002 | Dibene, II | G06F 1/18 361/711 |
| 2002/0041486 A1* | 4/2002 | Hildebrandt | H01L 23/427 361/700 |
| 2003/0181075 A1* | 9/2003 | Hartke | H05K 1/141 439/67 |
| 2004/0045730 A1* | 3/2004 | Garner | H05K 7/20681 174/16.3 |
| 2004/0104012 A1* | 6/2004 | Zhou | H01L 23/427 165/104.26 |
| 2004/0118142 A1* | 6/2004 | Hsu | B60L 1/02 62/259.2 |
| 2005/0168947 A1* | 8/2005 | Mok | H01L 23/427 361/698 |
| 2006/0005980 A1* | 1/2006 | Garner | H05K 7/20681 174/16.3 |
| 2006/0087814 A1* | 4/2006 | Brandon | H05K 7/20563 361/694 |
| 2007/0115635 A1* | 5/2007 | Low | H05K 7/20 361/700 |
| 2007/0284089 A1* | 12/2007 | Vadakkanmaruveedu | F28D 15/0233 165/104.26 |
| 2008/0084667 A1* | 4/2008 | Campbell | H05K 7/20009 361/702 |
| 2008/0165502 A1* | 7/2008 | Furman | H01L 23/433 361/709 |
| 2009/0268403 A1 | 10/2009 | Chen et al. | |
| 2009/0268410 A1 | 10/2009 | Kreissig et al. | |
| 2009/0323288 A1 | 12/2009 | Bernard | |
| 2010/0128436 A1* | 5/2010 | Edmunds | H01L 23/427 361/700 |
| 2011/0108237 A1 | 5/2011 | Kamath et al. | |
| 2011/0176278 A1 | 7/2011 | Park et al. | |
| 2012/0206880 A1* | 8/2012 | Andres | H01L 23/4275 361/700 |
| 2013/0208421 A1* | 8/2013 | Chester | H05K 7/20772 361/699 |
| 2013/0208422 A1* | 8/2013 | Hughes | H05K 7/20445 361/700 |
| 2014/0008756 A1 | 1/2014 | Pei et al. | |
| 2014/0118920 A1 | 5/2014 | Ng et al. | |
| 2014/0247560 A1* | 9/2014 | Lemberg | H01L 23/36 361/705 |
| 2014/0268572 A1* | 9/2014 | Ranjan | H05K 7/20336 361/700 |
| 2014/0293541 A1* | 10/2014 | Opila | F28D 15/02 361/697 |
| 2015/0009624 A1* | 1/2015 | Dunwoody | F28F 9/007 361/688 |
| 2015/0009631 A1* | 1/2015 | Joshi | H01L 23/4336 361/717 |
| 2015/0016062 A1* | 1/2015 | Robert | H05K 7/2029 361/700 |
| 2015/0092348 A1 | 4/2015 | Newhouse et al. | |
| 2015/0093098 A1 | 4/2015 | Fitton et al. | |
| 2015/0253822 A1* | 9/2015 | Degner | G06F 1/20 361/679.47 |
| 2015/0289410 A1* | 10/2015 | Salat | H01L 23/473 361/699 |
| 2015/0323262 A1* | 11/2015 | Kim | G06F 1/203 361/700 |
| 2015/0373827 A1 | 12/2015 | Guo et al. | |
| 2016/0219756 A1* | 7/2016 | Sun | F28D 15/0233 |
| 2016/0270255 A1 | 9/2016 | Duncan et al. | |
| 2017/0156240 A1* | 6/2017 | Silvennoinen | H05K 7/20936 |
| 2018/0249591 A1 | 8/2018 | Audemar | |
| 2019/0021188 A1* | 1/2019 | Phan | F28D 15/02 |

OTHER PUBLICATIONS

Susheela Nanjunda Rao Narasimhan, et al; Apparatus, System, and Method for Decreasing Heat Migration in Ganged Heatsinks; U.S. Appl. No. 15/144,612, filed May 2, 2016.

Buildcomputers.net, Power Consumption of PC Components in Watts, Copyright © 2012-2016, http://www.buildcomputers.net/power-consumption-of-pc-components.htm l, bui ldcomputers. net, pp. 1-6.

Wikipedia, Operating temperature, Sep. 26, 2010, https://web.archive.org/web/20100926001547/http:/!en.wikipedia.org/wiki/Operating_temperature, pp. 1-3.

* cited by examiner

Vapor Chamber
100

APPARATUS, SYSTEM, AND METHOD FOR IMPROVED HEAT SPREADING IN HEATSINKS

BACKGROUND

The power dissipation of electronic components within network devices (such as routers and/or switches) has increased significantly over the last several years. For example, the power dissipation of Application-Specific Integrated Circuits (ASICs) in network devices has increased from approximately 10-15 watts to approximately 100-150 watts over the last 15 years. Similarly, the power dissipation of memory devices in such network devices has increased from approximately 1-2 watts to approximately 5-10 watts over the same timespan.

In contrast, the amount of space (sometimes referred to as real estate) available on such network devices has decreased significantly over the last several years. For example, while the power dissipation of ASICs in network devices has increased tenfold over the last 15 years, the real estate available on circuit boards and chasses within such network devices has decreased due to the high demand for miniaturization and additional network bandwidth. Likewise, the real estate available on racks and/or data centers that house such network devices has decreased for the same reasons.

Unfortunately, the performance and/or reliability of the electronic components within network devices may be impaired as the operating temperature of these components rises beyond a certain level. The operating temperature of these components may directly correlate to the amount of power dissipated by the same. For example, the operating temperature of an ASIC or memory device may increase in conjunction with the amount of power dissipated by the ASIC or memory device.

In an effort to maintain the operating temperature of the electronic components within a certain level to achieve optimal performance, network device designers may apply common heatsinks to some of the electronic components. These common heatsinks may absorb heat produced by the electronic components and/or spread the heat, thereby cooling the electronic components. In addition, network device designers may include hot-swappable fan trays that blow air on the electronic components, thereby cooling the same.

In some examples, the combination of heatsinks and fan trays may be sufficient to keep the operating temperature of these electronic components within a safe and/or reliable range. However, in the event that a network administrator removes a hot-swappable fan tray from a network device while the network device continues running, the operating temperature of these electronic components may rise beyond the safe and/or reliable range after only a short period of time. As a result, these electronic components may fail and/or begin to perform sub-optimally.

The instant disclosure, therefore, identifies and addresses a need for additional and improved apparatuses, systems, and methods for improved heat spreading in heatsinks.

SUMMARY

As will be described in greater detail below, the instant disclosure generally relates to apparatuses, systems, and methods for improved heat spreading in heatsinks. In one example, an apparatus for accomplishing such a task may include (1) a plurality of vapor chambers that (A) are mounted to a plurality of individual power components that dissipate heat within a computing device and (B) absorb heat dissipated by the plurality of individual power components within the computing device and (2) at least one thermal coupling that (A) physically bridges the plurality of vapor chambers to one another within the computing device and (B) facilitates heat transfer among the plurality of vapor chambers mounted to the individual power components.

Similarly, a computing device incorporating the above-described apparatus may include (1) a plurality of individual power components that dissipate heat and (2) a heatsink assembly that includes (A) a plurality of vapor chambers that (I) are mounted to the plurality of individual power components that dissipate heat within a computing device and (II) absorb heat dissipated by the plurality of individual power components within the computing device and (B) at least one thermal coupling that (I) physically bridges the plurality of vapor chambers to one another within the computing device and (II) facilitates heat transfer among the plurality of vapor chambers mounted to the individual power components.

A corresponding method may include (1) mounting a plurality of vapor chambers to a plurality of individual power components that dissipate heat within a computing device, (2) physically bridging the plurality of vapor chambers to one another within the computing device by way of a thermal coupling that facilitates heat transfer among the plurality of vapor chambers mounted to the individual power components, (3) absorbing, via the plurality of vapor chambers, heat dissipated by the plurality of individual power components within the computing device, and then (4) spreading the absorbed heat among the plurality of vapor chambers by way of the thermal coupling.

Features from any of the above-mentioned embodiments may be used in combination with one another in accordance with the general principles described herein. These and other embodiments, features, and advantages will be more fully understood upon reading the following detailed description in conjunction with the accompanying drawings and claims.

BRIEF DESCRIPTION OF THE DRAWINGS

The accompanying drawings illustrate a number of exemplary embodiments and are a part of the specification. Together with the following description, these drawings demonstrate and explain various principles of the instant disclosure.

Throughout the drawings, identical reference characters and descriptions indicate similar, but not necessarily identical, elements. While the exemplary embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the instant disclosure covers all modifications, equivalents, and alternatives falling within the scope of the appended claims.

DETAILED DESCRIPTION OF EXEMPLARY EMBODIMENTS

The present disclosure describes various apparatuses, systems, and methods for improved heat spreading in heatsinks. As will be explained in greater detail below, embodiments of the instant disclosure may be able to improve heat spreading in heatsinks by enabling individual vapor chambers to interface with individual high power components with minimal thermal resistance. Additionally, or alternatively, embodiments of the instant disclosure may mitigate the traditional need to design each individual heatsink to account for the worst case maximum power dissipation of individual high power components and/or the traditional need to apply thick gap pads between high power components and a single common heatsink. Embodiments of the instant disclosure may also prevent the operating temperature of high power components from rising above their safe and/or reliable range even in the event that a network administrator removes a hot-swappable fan tray from the corresponding device during operation.

Figure 1:
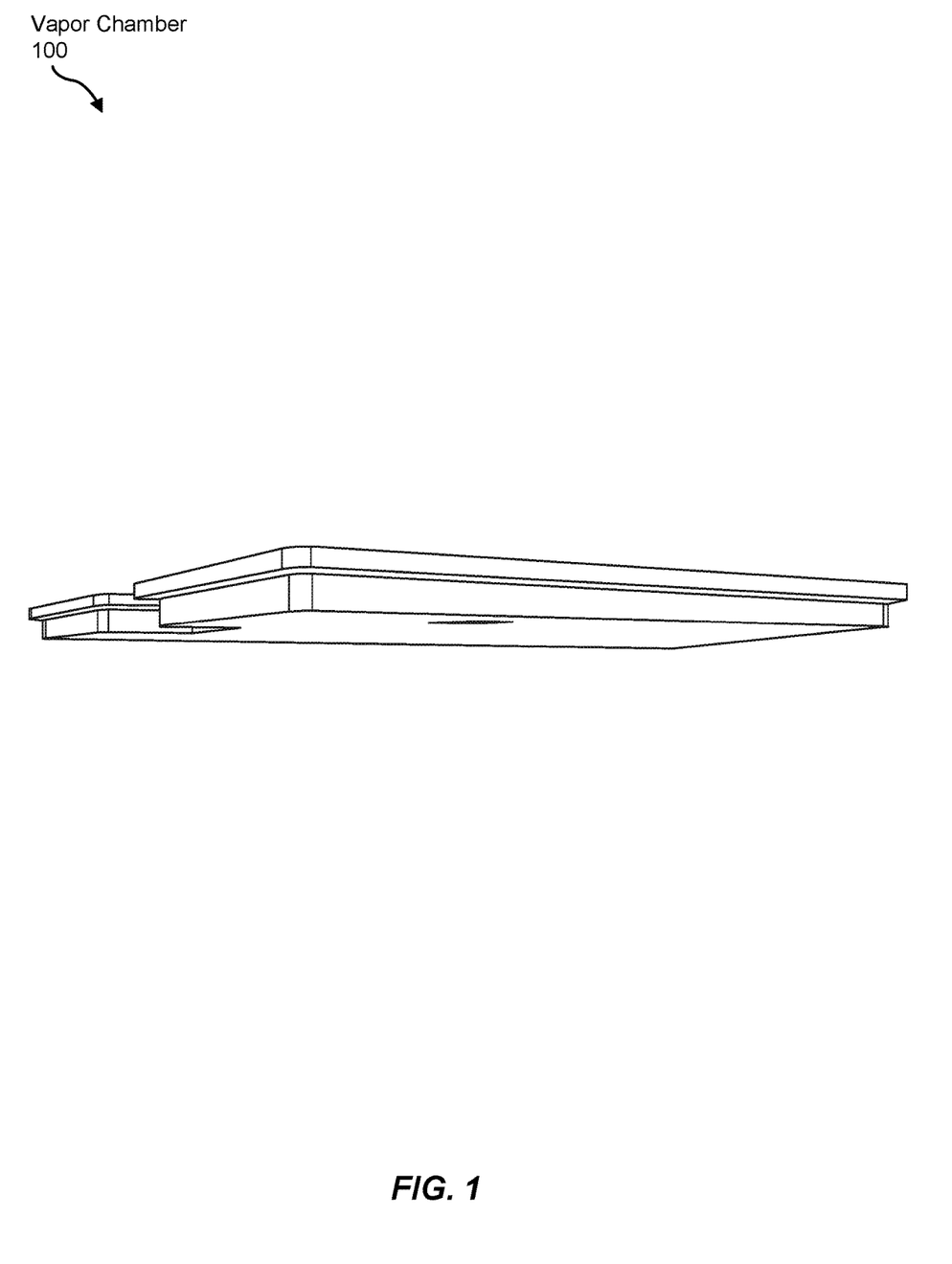
FIG. 1 is a block diagram of an exemplary vapor chamber.
Figure 2:
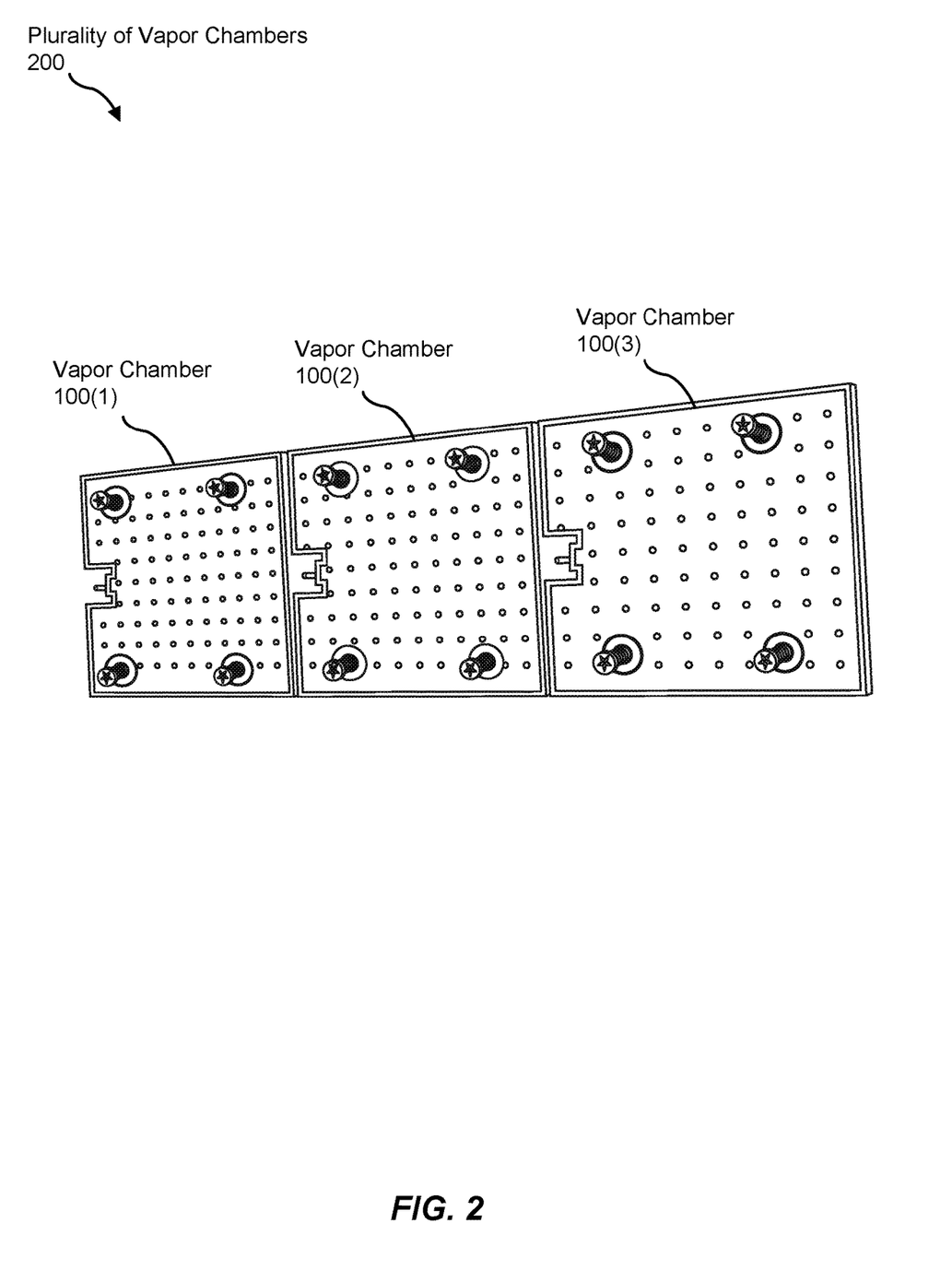
FIG. 2 is a block diagram of a plurality of exemplary vapor chambers.

The following will provide, with reference to FIGS. 1 and 2, examples of vapor chambers for improved heat spreading in heatsinks. The discussion corresponding to FIGS. 3-9 will provide detailed descriptions of exemplary apparatuses for improved heat spreading in heatsinks. Finally, the discussion corresponding to FIG. 10 will provide a detailed description of an exemplary method for improved heat spreading in heatsinks.

FIG. 1 shows an exemplary vapor chamber 100 that facilitates improved heat spreading in heatsinks. As illustrated in FIG. 1, vapor chamber 100 may include and/or represent a thin and/or planar heat-transfer device. In this example, vapor chamber 100 may form an airtight vessel that holds some form of liquid (such as water, methanol, and/or acetone) that serves as a coolant. Additionally or alternatively, vapor chamber 100 may combine and/or account for principles of thermal conductivity and phase transition to support heat transfer between solid structures. Vapor chamber 100 may absorb heat dissipated by a power component within a computing device.

FIG. 2 shows a plurality of exemplary vapor chambers 100(1), 100(2), and 100(3) that facilitate improved heat spreading in heatsinks. As illustrated in FIG. 2, vapor chambers 100(1)-(3) may each include and/or represent a thin and/or planar heat-transfer device. In this example, vapor chambers 100(1)-(3) may be arranged and/or configured linearly relative to one another within a computing device. As will be described in greater detail below, vapor chambers 100(1)-(3) may be physically bridged to one another by one or more thermal couplings. These thermal couplings may facilitate heat transfer among vapor chambers 100(1)-(3).

Figure 3:
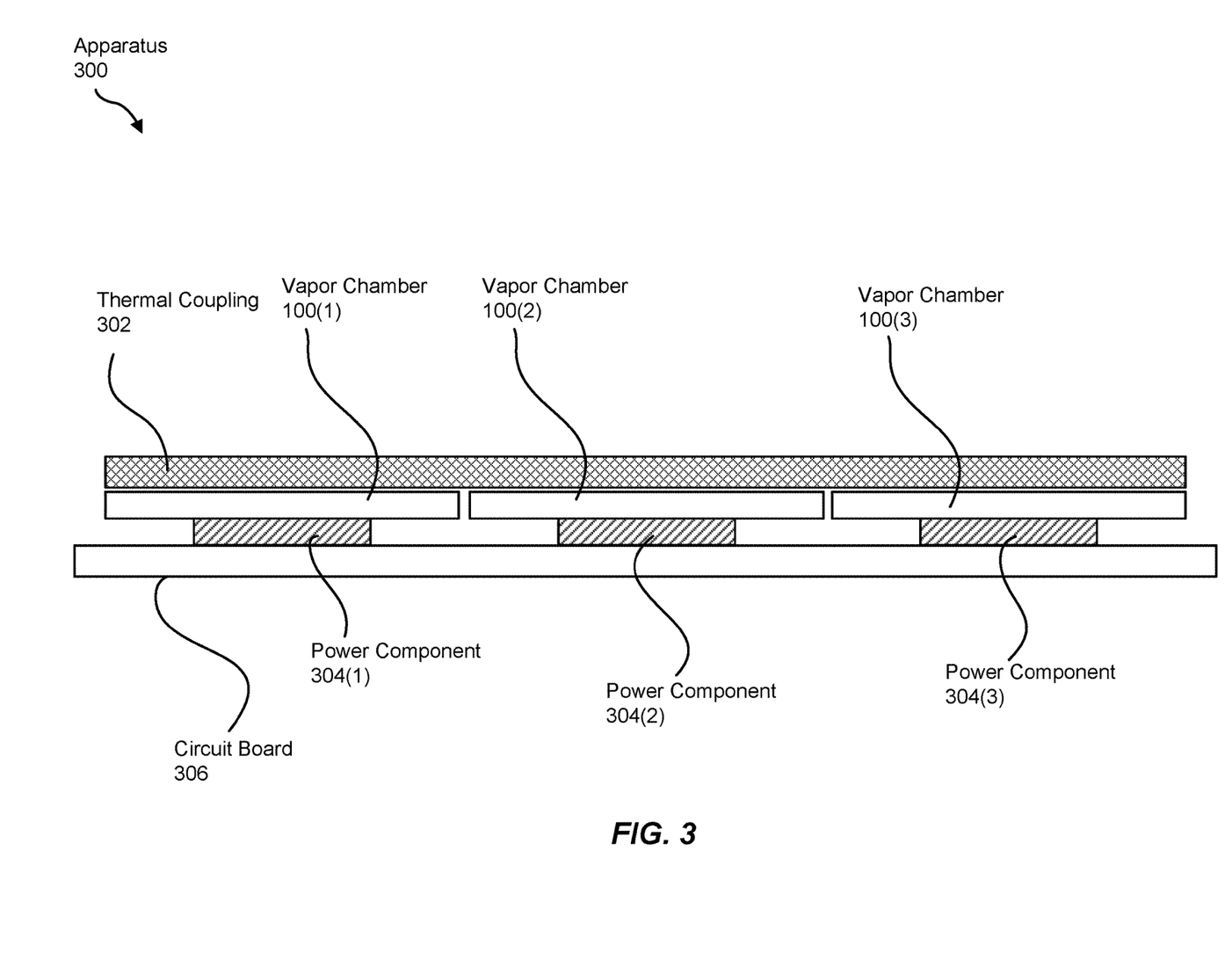
FIG. 3 is a block diagram of an exemplary apparatus for improved heat spreading in heatsinks.

FIG. 3 shows an exemplary apparatus 300 for improved heat spreading in heatsinks. As illustrated in FIG. 3, exemplary apparatus 300 may include vapor chambers 100(1)-(3) and a thermal coupling 302. In this example, vapor chambers 100(1), 100(2), and 100(3) may physically interface with and/or be applied or mounted to power components 304(1), 304(2), and 304(3), respectively. Power components 304(1)-(3) may be soldered and/or attached to a circuit board 306 within a computing device.

Continuing with this example, thermal coupling 302 may physically bridge vapor chambers 100(1)-(3) to one another within the computing device. In doing so, thermal coupling 302 may facilitate heat transfer among vapor chambers 100(1)-(3), which physically interface with and/or are applied or mounted to power components 304(1)-(3).

In some examples, thermal coupling 302 may include and/or represent a common heatsink (sometimes also referred to as a ganged heatsink). In one example, thermal coupling 302 may include and/or represent a single finned heatsink that is installed on and/or applied to vapor chambers 100(1)-(3). This single finned heatsink may include a plurality of fins and/or pins that extend from a base.

In one example, the single finned heatsink may include at least one additional vapor chamber (separate from vapor chambers 100(1)-(3)) that facilitates and/or improves lateral heat spreading throughout the single finned heatsink. Additionally or alternatively, the single finned heatsink may include at least one heat pipe that facilitates and/or improves lateral heat spreading throughout the single finned heatsink.

Although not necessarily illustrated in this way in FIG. 3, apparatus 300 may also include at least one thermally conductive gap pad that resides between vapor chambers 100(1)-(3) and the single finned heatsink. In some examples, this gap pad may be flexible, malleable, compressible, formable, and/or shapeable to account for power component height tolerance variations and/or vapor chamber height tolerance variations.

Apparatus 300 may be incorporated in a variety of different computing devices. In one example, such a computing device may include and/or represent a router (such as a provider edge router, a hub router, a spoke router, an autonomous system boundary router, and/or an area border router). Additional examples of such a computing device include, without limitation, switches, hubs, modems, bridges, repeaters, gateways, multiplexers, network adapters, network interfaces, network racks, chasses, servers, client devices, laptops, tablets, desktops, cellular phones, Personal Digital Assistants (PDAs), multimedia players, embedded systems, wearable devices (e.g., smart watches, smart glasses, etc.), gaming consoles, portions of one or more of the same, combinations or variations of one or more of the same, and/or any other suitable network device.

Figure 4:
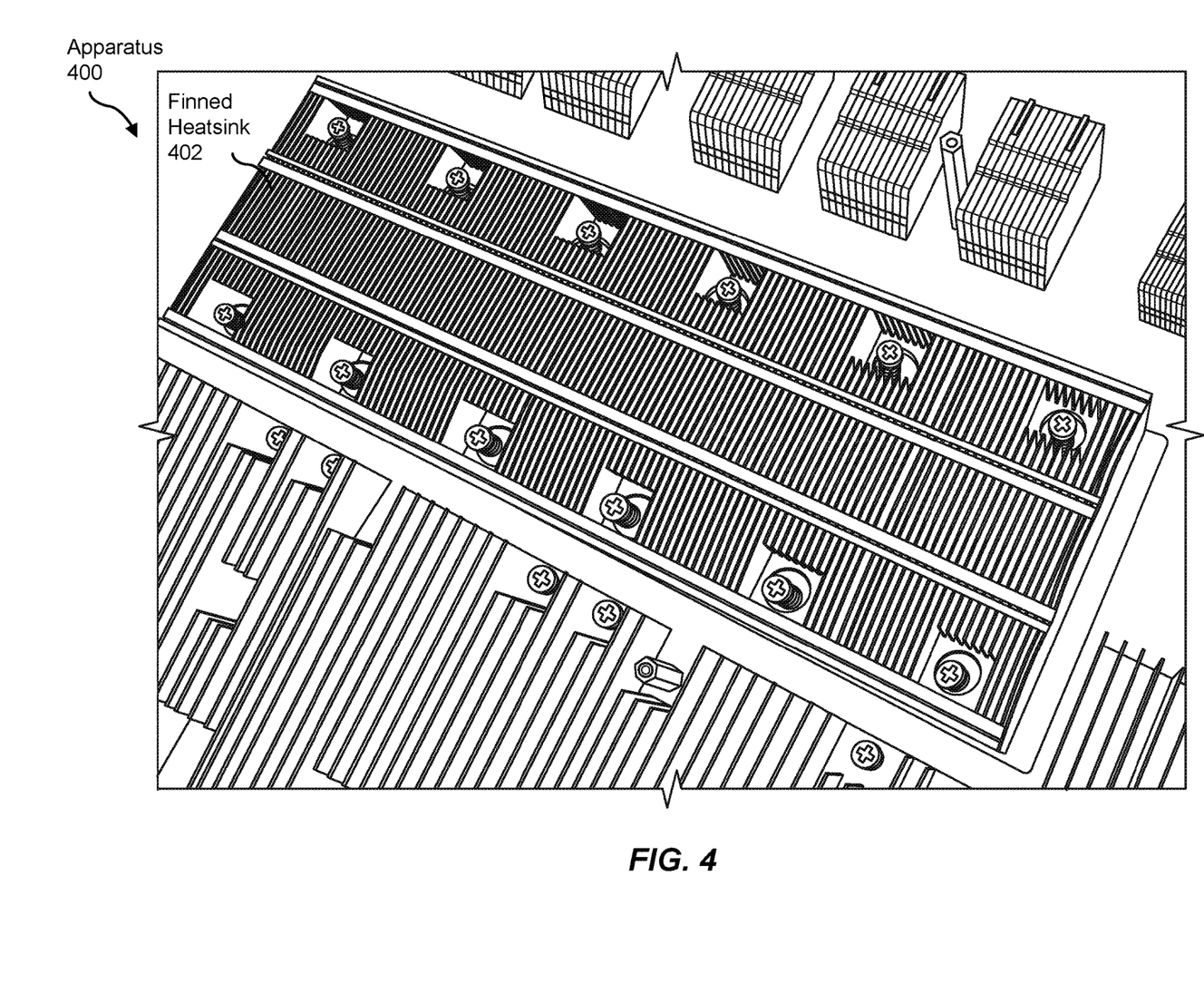
FIG. 4 is an illustration of an exemplary apparatus for improved heat spreading in heatsinks.

FIG. 4 shows an exemplary apparatus 400 that facilitates improved heat spreading in heatsinks. As illustrated in FIG. 4, apparatus 400 may include a finned heatsink 402 applied to and/or installed on a plurality of vapor chambers (not explicitly illustrated in FIG. 4) within a computing device. In this example, finned heatsink 402 may physically bridge the vapor chambers to one another and/or facilitate heat transfer among the vapor chambers as heat is emitted by power components.

Figure 5:
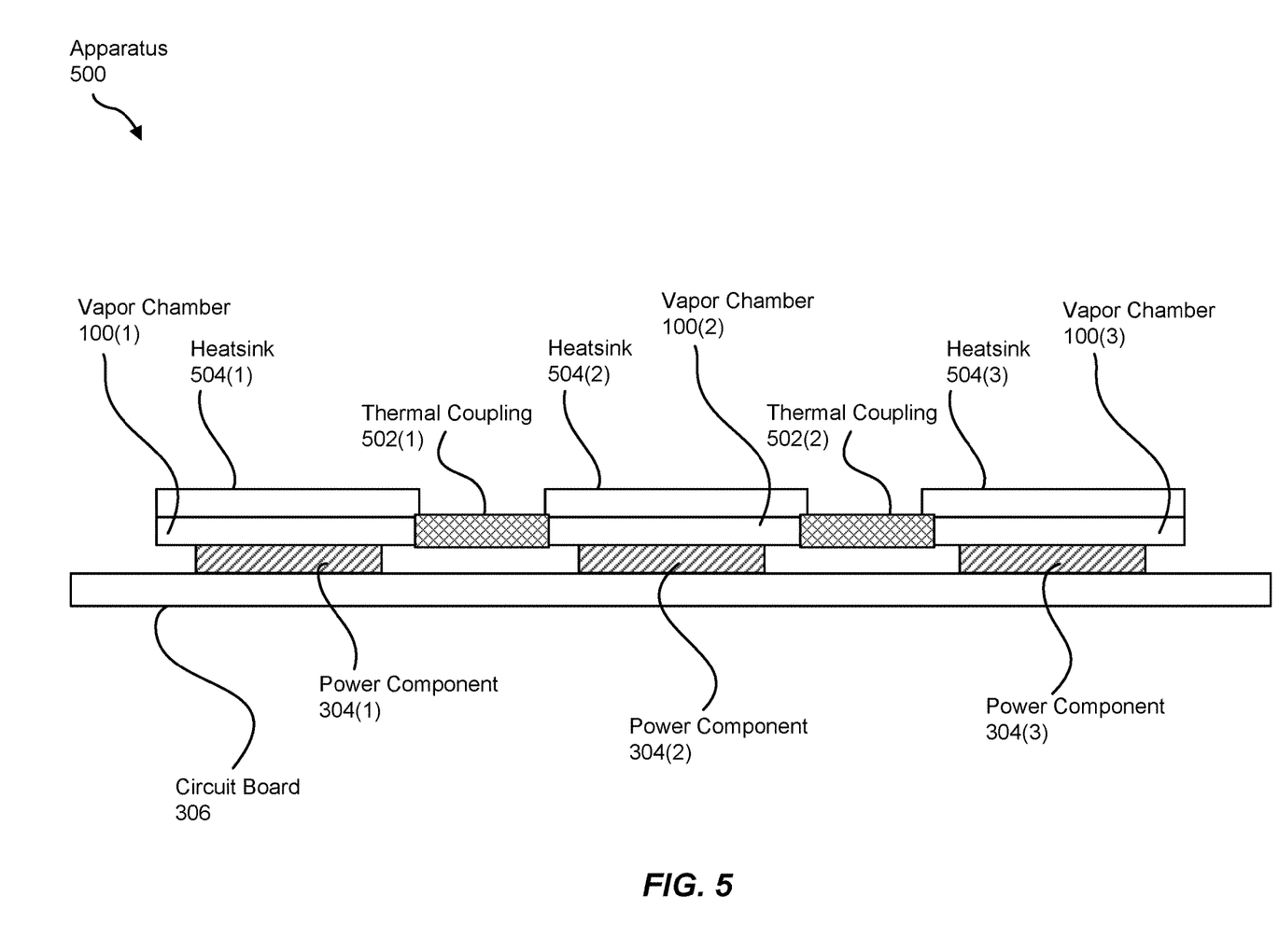
FIG. 5 is a block diagram of an exemplary apparatus for improved heat spreading in heatsinks.

FIG. 5 shows an exemplary apparatus 500 for improved heat spreading in heatsinks. As illustrated in FIG. 5, exemplary apparatus 500 may include vapor chambers 100(1)-(3), thermal couplings 502(1) and 502(2), and heatsinks 502(1), 502(2), and 502(3). In this example, vapor chambers 100(1), 100(2), and 100(3) may physically interface with and/or be applied or mounted to power components 304(1), 304(2), and 304(3), respectively. Power components 304(1)-(3) may be soldered and/or attached to a circuit board 306 within a computing device.

Continuing with this example, thermal couplings 502(1) and 502(2) may physically bridge vapor chambers 100(1)-(3) to one another within the computing device. In doing so, thermal coupling 302(1) and 302(2) may facilitate heat transfer among vapor chambers 100(1)-(3), which physically interface with and/or are applied or mounted to power components 304(1)-(3).

In some examples, thermal couplings 502(1) and 502(2) may each include and/or represent at least one heat pipe that attaches multiple vapor chambers to one another and/or runs through multiple vapor chambers. In other examples, thermal couplings 502(1) and 502(2) may each include and/or represent a graphite sheet that connects multiple vapor chambers to one another.

In some examples, heatsinks 504(1)-(3) may each include and/or represent a finned heatsink that is installed on and/or applied to one of vapor chambers 100(1)-(3). In such examples, these finned heatsinks may include a plurality of fins and/or pins that extend from a base.

Although not necessarily illustrated in this way in FIG. 5, apparatus 500 may also include thermally conductive gap pads that reside between vapor chambers 100(1)-(3) and heatsinks 504(1)-(3). In some examples, these gap pads may be flexible, malleable, compressible, formable, and/or shapeable to account for power component height tolerance variations and/or vapor chamber height tolerance variations.

Figure 6:
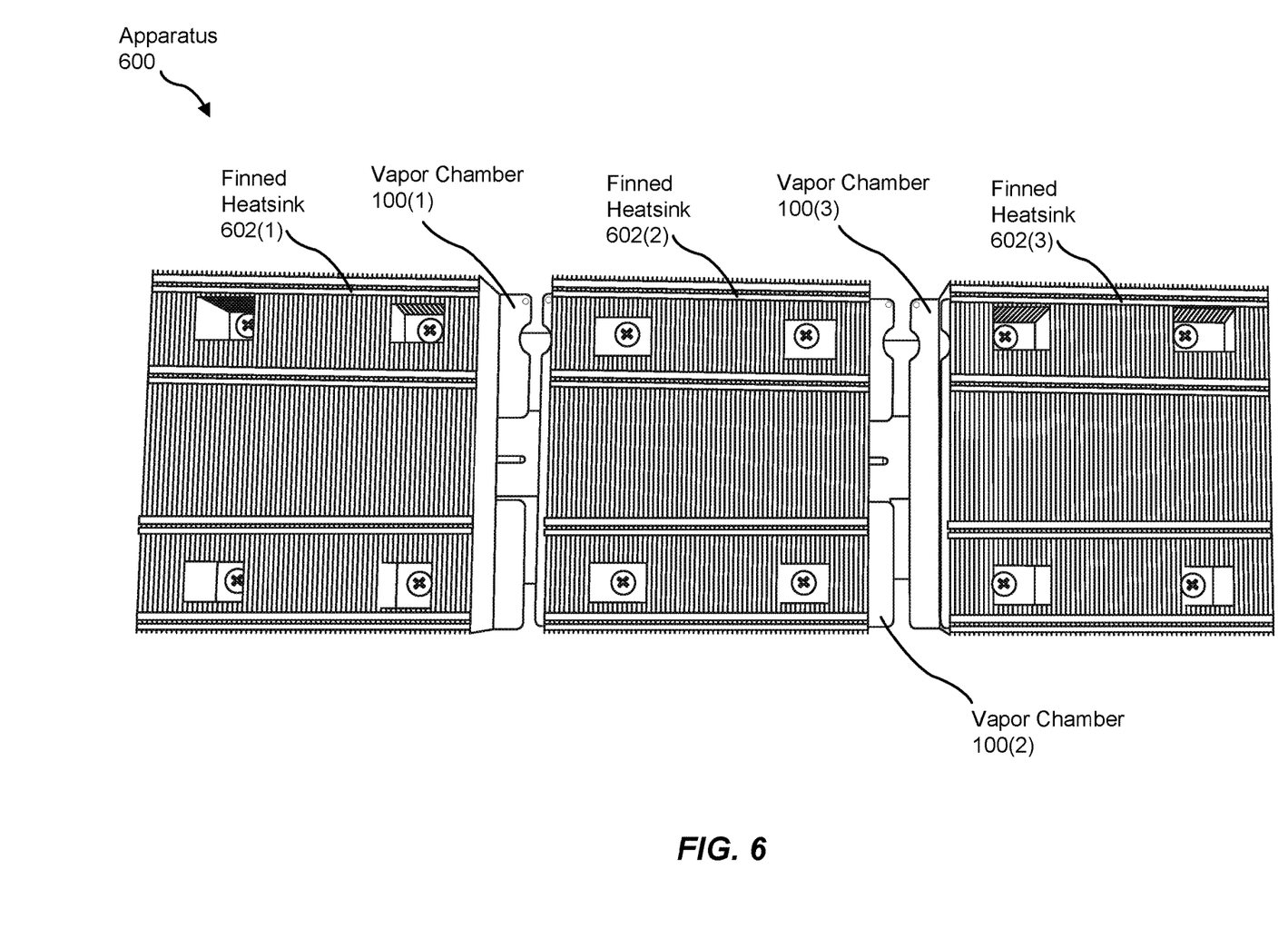
FIG. 6 is an illustration of an exemplary apparatus for improved heat spreading in heatsinks.

FIG. 6 shows an exemplary apparatus 600 that facilitates improved heat spreading in heatsinks. As illustrated in FIG. 6, apparatus 600 may include finned heatsinks 602(1), 602(2), and 602(3) applied to and/or installed on vapor chambers 100(1), 100(2), and 100(3), respectively, within a computing device. In this example, although mounted and/or installed next to one another, finned heatsinks 602(1)-(3) may include and/or form gaps or finless areas in between one another. As will be described in greater detail below in connection with FIGS. 7-9, these gaps and/or finless areas may be bridged by thermal couplings (such as heat pipes or graphite sheets).

Figure 7:
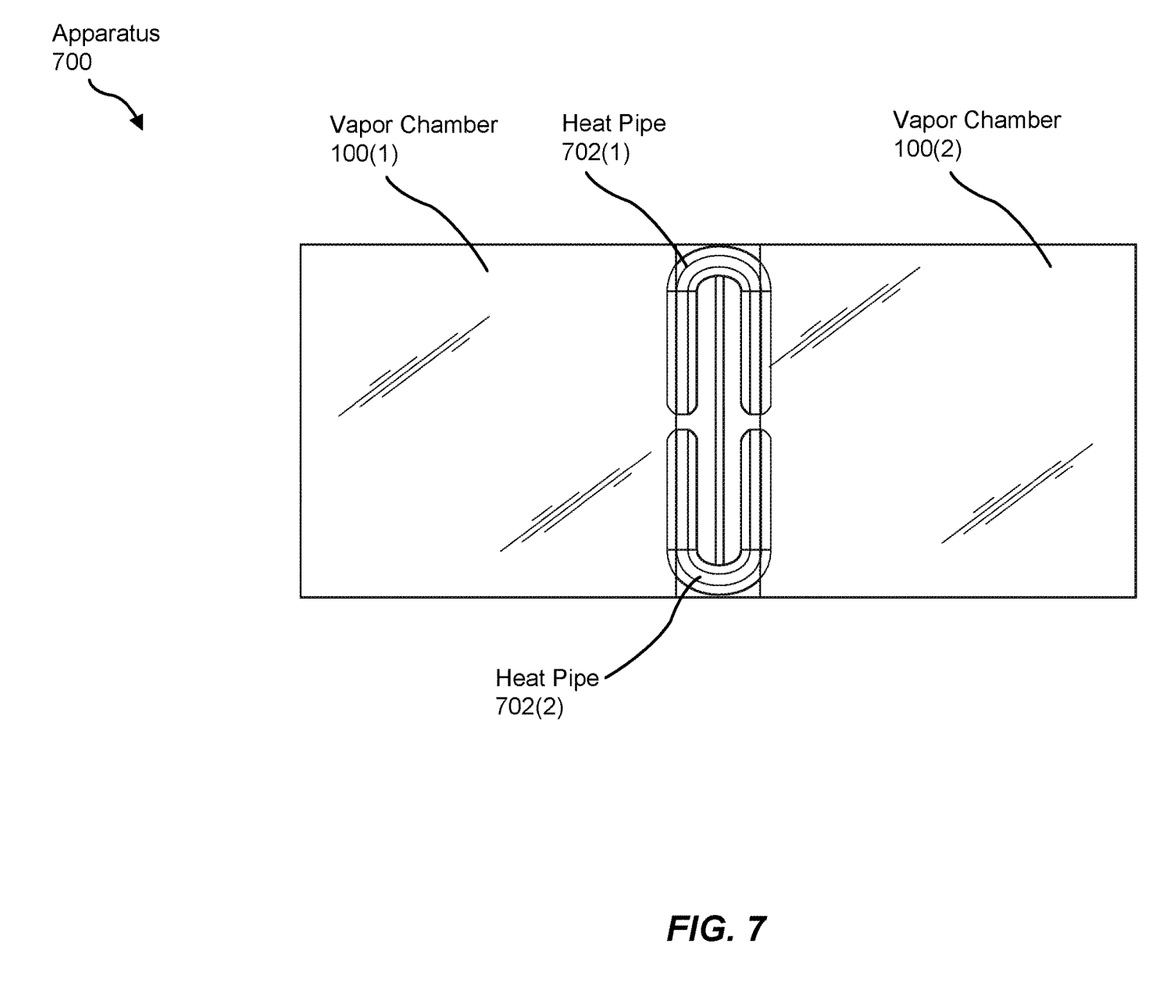
FIG. 7 is an illustration of an exemplary apparatus for improved heat spreading in heatsinks.

FIG. 7 shows an exemplary apparatus 700 that facilitates improved heat spreading in heatsinks. As illustrated in FIG. 7, apparatus 700 may include heat pipes 702(1) and 702(2) that run through vapor chambers 100(1) and 100(2) and/or connect vapor chambers 100(1) and 100(2) to one another within a computing device. In this example, apparatus 700 may also include heat pipes 702(1) and 702(2) that physically bridge vapor chambers 100(1) and 100(2) to one another and/or facilitate heat transfer between vapor chambers 100(1) and 100(2) as heat is emitted by power components. Heat pipes 702(1) and 702(2) may each include and/or represent a heat-transfer device that combines and/or accounts for principles of thermal conductivity and phase transition to support heat transfer between solid structures. In addition, heat pipes 702(1) and 702(2) may include and/or represent bendable material that facilitates bending to account for height tolerance variations among the individual power components and vapor chambers 100(1) and 100(2).

Figure 8:
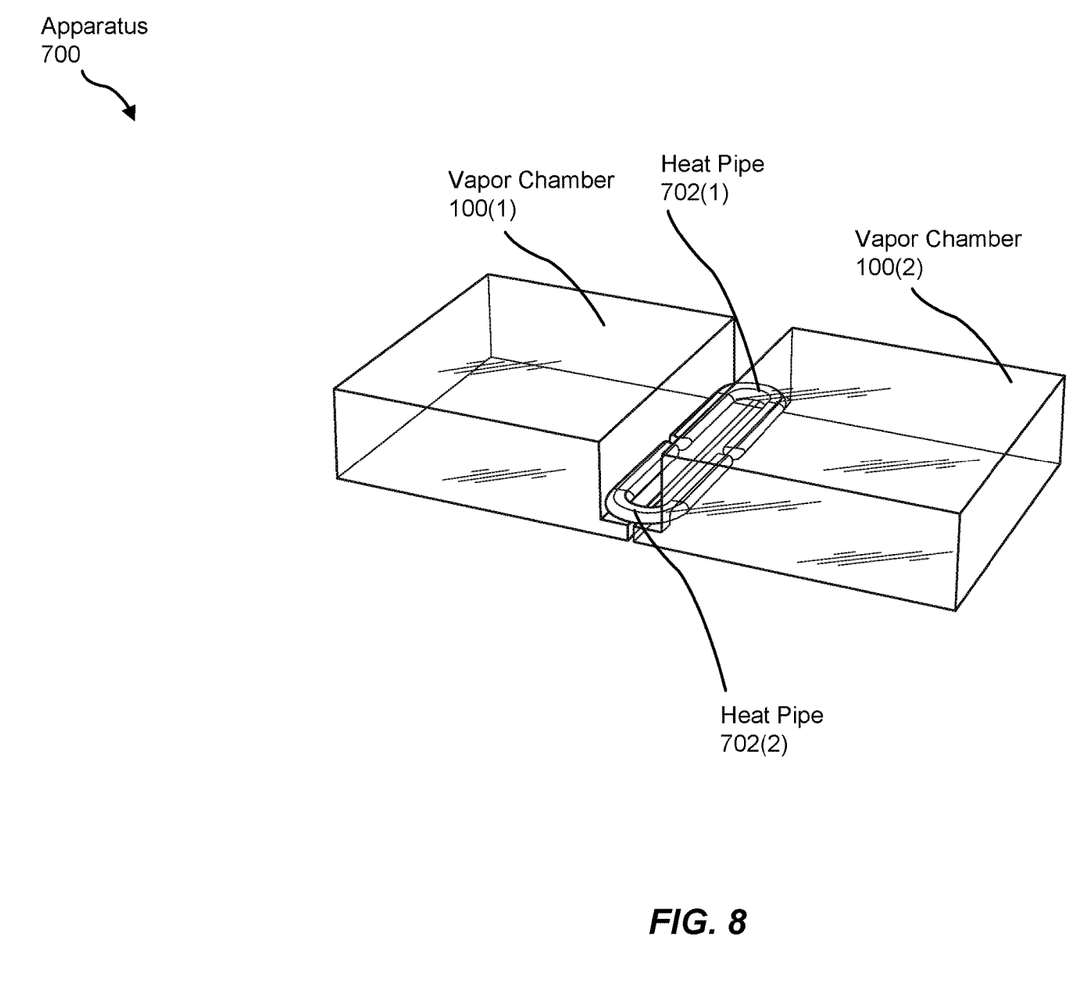
FIG. 8 is an illustration of an exemplary apparatus for improved heat spreading in heatsinks.

FIG. 8 shows exemplary apparatus 700 from a different perspective than FIG. 7. As illustrated in FIG. 8, apparatus 700 may include heat pipes 702(1) and 702(2) that run through vapor chambers 100(1) and 100(2) and/or connect vapor chambers 100(1) and 100(2) to one another within a computing device. In this example, apparatus 700 may also include heat pipes 702(1) and 702(2) that physically bridge vapor chambers 100(1) and 100(2) to one another and/or facilitate heat transfer between vapor chambers 100(1) and 100(2) as heat is emitted by power components. Although not explicitly illustrated in this way in FIG. 7 or 8, vapor chambers 100(1) and 100(2) may each include and/or incorporate a heatsink (such as a finned heatsink). Additionally or alternatively, a heatsink may be attached and/or connected to each of vapor chambers 100(1) and 100(2).

Figure 9:
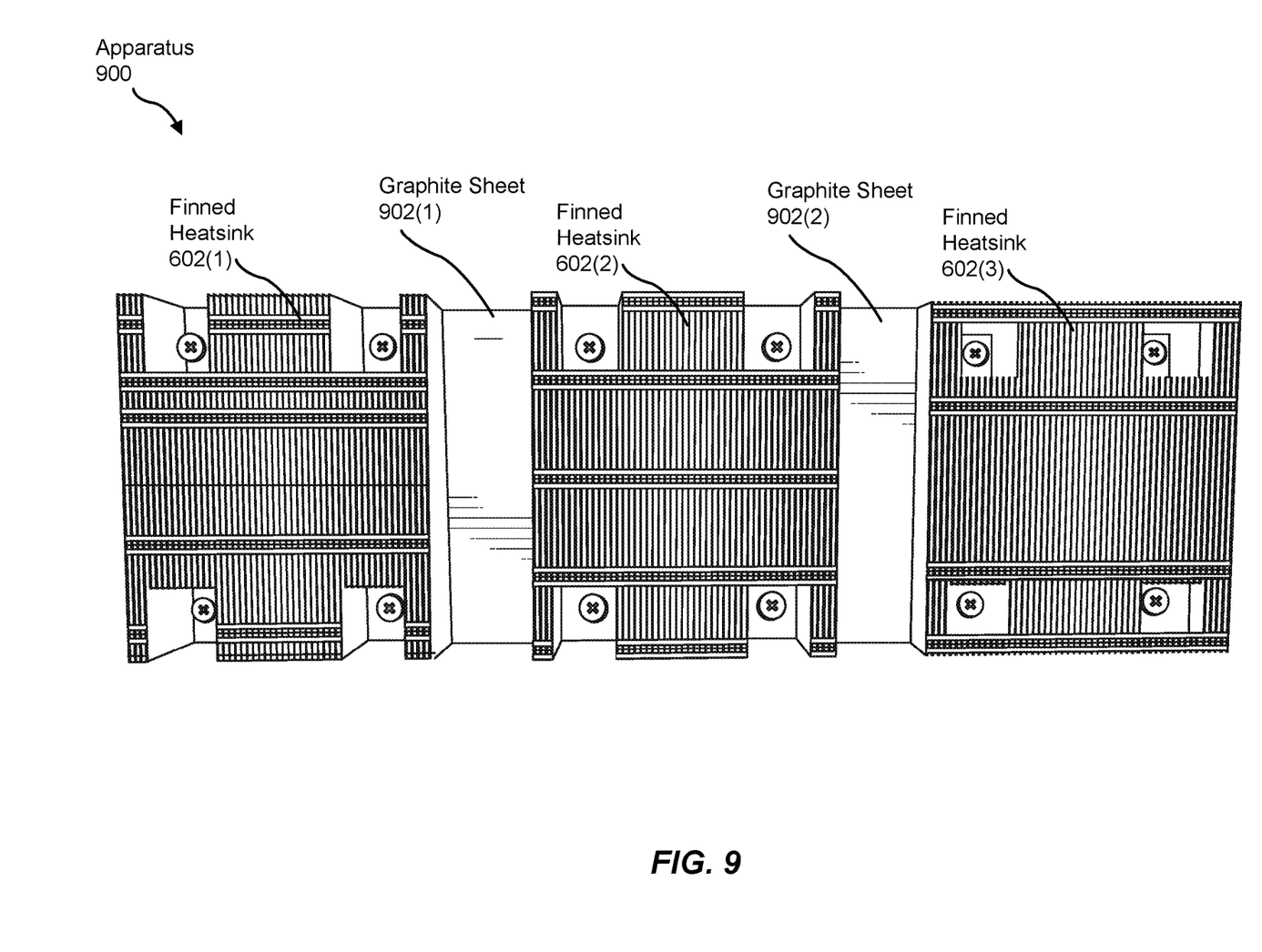
FIG. 9 is an illustration of an exemplary apparatus for improved heat spreading in heatsinks.

FIG. 9 shows an exemplary apparatus 900 that facilitates improved heat spreading in heatsinks. As illustrated in FIG. 9, apparatus 900 may include finned heatsinks 602(1), 602(2), and 602(3) applied to and/or installed on vapor chambers 100(1), 100(2), and 100(3), respectively, within a computing device. In this example, apparatus 900 may also include graphite sheets 902(1) and 902(2) that physically bridge vapor chambers 100(1)-(3) to one another and/or facilitate heat transfer among vapor chambers 100(1)-(3) as heat is emitted by power components. Graphite sheets 902(1) and 902(2) may include and/or represent bendable material that facilitates bending to account for height tolerance variations among the individual power components and vapor chambers 100(1) and 100(2).

Figure 10:
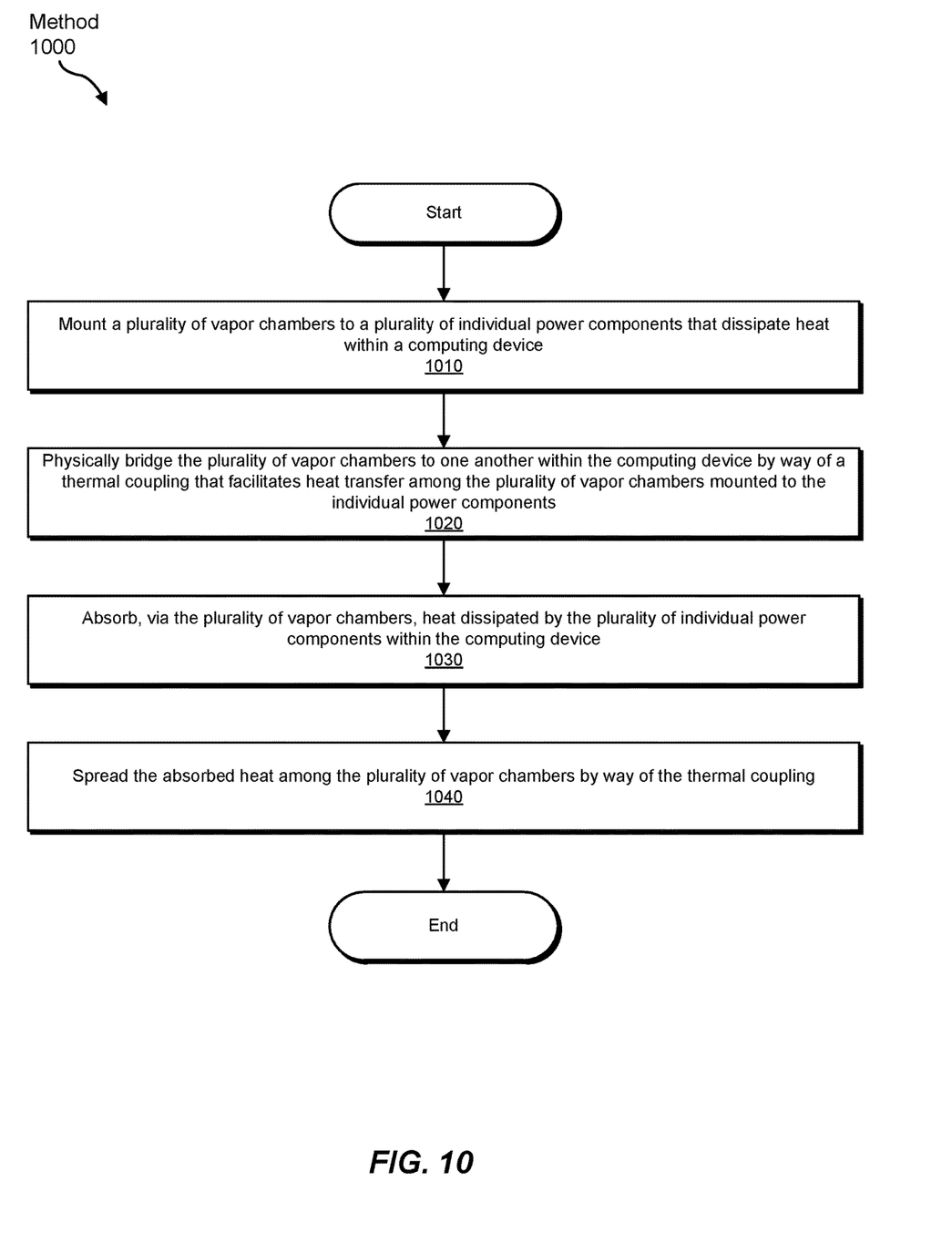
FIG. 10 is a flow diagram of an exemplary method for improved heat spreading in heatsinks.

FIG. 10 is a flow diagram of an exemplary method 1000 for improved heat spreading in heatsinks. Method 1000 may include the step of mounting a plurality of vapor chambers to a plurality of individual power components that dissipate heat within a computing device (1010). This mounting step may be performed in a variety of ways. For example, a telecommunications equipment manufacturer may manually and/or robotically mount vapor chambers 100(1)-(3) to power components 304(1)-(3), respectively, when assembling a telecommunications device (such as a router). In this example, power components 304(1)-(3) may dissipate and/or emit heat when the telecommunications device is powered on and operational.

Returning to FIG. 10, method 1000 may also include the step of physically bridging the plurality of vapor chambers to one another within the computing device by way of a thermal coupling that facilitates heat transfer among the plurality of vapor chambers mounted to the individual power components (1020). This physically bridging step may be performed in a variety of ways. For example, the telecommunications equipment manufacturer may apply and/or install at least one thermal coupling (such as a single common heatsink, heat pipes, and/or graphite sheets) to vapor chambers 100(1)-(3). In this example, the thermal coupling may physically bridge vapor chambers 100(1)-(3) to one another within the telecommunications device. In addition, the thermal coupling may facilitate heat transfer among vapor chambers 100(1)-(3) mounted to power components 304(1)-(3).

Returning to FIG. 10, method 1000 may also include the step of absorbing, via the plurality of vapor chambers, heat dissipated by the plurality of individual power components within the computing device (1030). This absorbing step may be performed in a variety of ways. For example, once the telecommunications device is powered on, power components 304(1)-(3) may dissipate and/or emit heat. In this example, vapor chambers 100(1)-(3) may absorb heat dissipated and/or emitted by power components 304(1)-(3) while the telecommunications device is operational.

Returning to FIG. 10, method 1000 may also include the step of spreading the absorbed heat among the plurality of vapor chambers by way of the thermal coupling (1040). This spreading step may be performed in a variety of ways. For example, as vapor chambers 100(1)-(3) absorb the heat dissipated and/or emitted by power components 304(1)-(3), the thermal coupling may spread the heat among vapor chambers 100(1)-(3). In this example, the thermal coupling may serve as a bridge that facilitates heat transfer among vapor chambers 100(1)-(3).

While the foregoing disclosure sets forth various embodiments using specific illustrations, flowcharts, and examples, each illustration component, flowchart step, operation, and/or component described and/or exemplified herein may be implemented, individually and/or collectively, using a wide range of hardware, software, or firmware (or any combination thereof) configurations. In addition, any disclosure of components contained within other components should be considered exemplary in nature since many other architectures can be implemented to achieve the same functionality.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the instant disclosure. The embodiments disclosed herein should be considered in all respects illustrative and not restrictive. Reference should be made to the appended claims and their equivalents in determining the scope of the instant disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. An apparatus comprising:
    a plurality of vapor chambers that:
        are mounted to a plurality of individual power components that:
            are soldered to a circuit board; and
            dissipate heat within a computing device;
        wherein each vapor chamber within the plurality of vapor chambers is mounted to a top side of a different individual power component within the plurality of individual power components; and
        absorb heat dissipated by the plurality of individual power components within the computing device; and
    at least one thermal coupling that:
        physically bridges the plurality of vapor chambers to one another within the computing device; and
        facilitates heat transfer among the plurality of vapor chambers mounted to the individual power components; and
        wherein the at least one thermal coupling comprises a plurality of U-shaped heat pipes that are each attached to the plurality of vapor chambers and each thermally couple the plurality of vapor chambers to one another.

2. The apparatus of claim 1, wherein the at least one thermal coupling further comprises at least one single finned heatsink that includes at least one of: an additional vapor chamber that facilitates lateral heat spreading throughout the at least one single finned heatsink; or an additional heat pipe that facilitates lateral heat spreading throughout the at least one single finned heatsink.

3. The apparatus of claim 2, further comprising at least one thermally conductive gap pad that resides between the plurality of vapor chambers and the at least one single finned heatsink.

4. The apparatus of claim 1, further comprising a plurality of finned heatsink components that are attached to the plurality of vapor chambers.

5. The apparatus of claim 1, wherein the at least one thermal coupling further comprises at least one graphite sheet that connects the plurality of vapor chambers to one another.

6. The apparatus of claim 1, wherein the at least one thermal coupling comprises a bendable material that facilitates bending the at least one thermal coupling to account for height tolerance variations among the plurality of individual power components and the plurality of vapor chambers.

7. A computing device comprising:
    a plurality of individual power components that:
        are soldered to a circuit board; and
        dissipate heat within the computing device;
    a heatsink assembly that comprises a plurality of vapor chambers that:
        are mounted to the plurality of individual power components, wherein each vapor chamber within the plurality of vapor chambers is mounted to a top side of a different individual power component within the plurality of individual power components; and
        absorb heat dissipated by the plurality of individual power components within the computing device; and at least one thermal coupling that:
    physically bridges the plurality of vapor chambers to one another within the computing device; and
    facilitates heat transfer among the plurality of vapor chambers mounted to the individual power components; and
    wherein the at least one thermal coupling comprises a plurality of U-shaped heat pipes that are each attached to the plurality of vapor chambers and each thermally couple the plurality of vapor chambers to one another.

8. The computing device of claim 7, wherein the at least one thermal coupling further comprises at least one single finned heatsink that includes at least one of: an additional vapor chamber that facilitates lateral heat spreading throughout the at least one single finned heatsink; or an additional heat pipe that facilitates lateral heat spreading throughout the at least one single finned heatsink.

9. The computing device of claim 8, further comprising at least one thermally conductive gap pad that resides between the plurality of vapor chambers and the at least one single finned heatsink.

10. The computing device of claim 7, further comprising a plurality of finned heatsink components that are attached to the plurality of vapor chambers.

11. The computing device of claim 7, wherein the at least one thermal coupling comprises at least one graphite sheet that connects the plurality of vapor chambers to one another.

12. The computing device of claim 7, wherein the at least one thermal coupling comprises a bendable material that facilitates bending the at least one thermal coupling to account for height tolerance variations among the plurality of individual power components and the plurality of vapor chambers.

13. A method comprising:
mounting a plurality of vapor chambers to a plurality of individual power components that:
are soldered to a circuit board; and
dissipate heat within a computing device;
wherein each vapor chamber within the plurality of vapor chambers is mounted to a top side of a different individual power component within the plurality of individual power components;
installing, to the plurality of vapor chambers, at least one thermal coupling that:
physically bridges the plurality of vapor chambers to one another within the computing device; and
facilitates heat transfer among the plurality of vapor chambers mounted to the individual power components;
wherein the at least one thermal coupling comprises a plurality of U-shaped heat pipes that are each attached to the plurality of vapor chambers and each thermally couple the plurality of vapor chambers to one another;
absorbing, via the plurality of vapor chambers, heat dissipated by the plurality of individual power components within the computing device; and
spreading the absorbed heat among the plurality of vapor chambers by way of the thermal coupling.

14. The method of claim 13, wherein the at least one thermal coupling further comprises at least one single finned heatsink that includes at least one of: an additional vapor chamber that facilitates lateral heat spreading throughout the at least one single finned heatsink; or an additional heat pipe that facilitates lateral heat spreading throughout the at least one single finned heatsink.

15. The method of claim 13, further comprising applying at least one thermally conductive gap pad between the plurality of vapor chambers and the at least one thermal coupling.

\* \* \* \* \*